United States Patent
Burnett et al.

(10) Patent No.: US 7,078,297 B2
(45) Date of Patent: Jul. 18, 2006

(54) MEMORY WITH RECESSED DEVICES

(75) Inventors: James D. Burnett, Austin, TX (US); Suresh Venkatesan, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 73 days.

(21) Appl. No.: 10/857,545

(22) Filed: May 28, 2004

(65) Prior Publication Data

US 2005/0266643 A1    Dec. 1, 2005

(51) Int. Cl.
*H01L 21/8234* (2006.01)
(52) U.S. Cl. ...................................... 438/275; 257/365
(58) Field of Classification Search .............. 257/365, 257/368, 510; 438/275, 427
See application file for complete search history.

(56) References Cited

U.S. PATENT DOCUMENTS

| | | | | |
|---|---|---|---|---|
| 6,258,673 | B1 * | 7/2001 | Houlihan et al. | 438/275 |
| 6,316,302 | B1 * | 11/2001 | Cheek et al. | 438/199 |
| 6,534,805 | B1 * | 3/2003 | Jin | 257/206 |
| 6,559,029 | B1 * | 5/2003 | Hur | 438/427 |
| 2003/0102518 | A1 | 6/2003 | Fried et al. | |

OTHER PUBLICATIONS

Yang, Fu-Liang et al.; "Strained FIP-SOI (FinFET/FD/PD-SOI) for Sub-65nm CMOS Scaling"; 2003 Symposium on VLSI Technology Digest of Technical Papers; 2003; pp 137-138.
Yang, Fu-Liang et al.; "A 65nm Node Strained SOI Technology with Slim Spacer"; 2003; 4 pgs; IEEE.

* cited by examiner

*Primary Examiner*—Christian D. Wilson
(74) *Attorney, Agent, or Firm*—Michael J. Balconi-Lamica; Michael P. Noonan

(57) ABSTRACT

A memory cell includes devices having associated isolation recesses of differing magnitudes. The effective channel width of a corresponding transistor is substantially equal to a channel top surface width plus twice a sidewall width formed by the isolation recesses. In an SRAM cell, a latch transistor has a larger effective channel width than an associated pass transistor by forming larger recesses, and therefore larger sidewalls in isolation layers surrounding the latch transistor and limiting such recesses for pass transistors. During manufacture of the memory cell, a mask is used to mask an area of the pass transistor while exposing an area of the latch transistor. Accordingly, recesses in an isolation layer around the latch transistor are formed without affecting a corresponding area around the pass transistor.

26 Claims, 3 Drawing Sheets

MEMORY WITH RECESSED DEVICES

BACKGROUND

The present disclosures relate generally to semiconductor memories, and more particularly, to semiconductor memories with recessed devices.

As bitcell size for static random access memories (SRAMs) continues to scale to smaller sizes, the bitcell current ($I_{cell}$) performance degrades. In addition, static noise margin (SNM) variation of the bitcell increases. Together, the degradation of $I_{cell}$ performance and the increase in SNM variation limits the low supply voltage ($V_{dd}$) operation of the bitcell.

Some SRAM devices have been known to achieve a higher bitcell current, however, the SRAM's beta ratio (i.e., the ratio of strength of the pull-down device to the pass device) suffers negatively. As a result, the adverse impact on the SRAM beta ratio degrades the SNM and makes the bitcell unstable at low $V_{dd}$ operation. Still further, the bitcell may be unstable even at nominal $V_{dd}$ operation. Furthermore, with scaling to smaller and smaller sizes, transistor threshold voltage ($V_t$) variation increases due to dopant fluctuations and variations in gate length.

Accordingly, it would be desirable to provide an improved memory for overcoming the problems in the art, as discussed above.

SUMMARY

According to one embodiment, a memory cell includes devices having associated isolation recesses of differing magnitudes. The effective channel width of a corresponding transistor is substantially equal to a channel top surface width plus twice a sidewall width formed by the isolation recesses. In an SRAM cell, a latch transistor has a larger effective channel width than an associated pass transistor by forming larger recesses, and therefore larger sidewalls in isolation layers surrounding the latch transistor, while limiting such recesses for pass transistors. During manufacture of the memory cell, a mask is used to mask an area of the pass transistor while exposing an area of the latch transistor. Accordingly, recesses in an isolation layer around the latch transistor are formed without affecting a corresponding area around the pass transistor.

BRIEF DESCRIPTION OF THE DRAWINGS

The embodiments of the present disclosure are illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve an understanding of the embodiments of the present disclosure.

DETAILED DESCRIPTION

Figure 1:
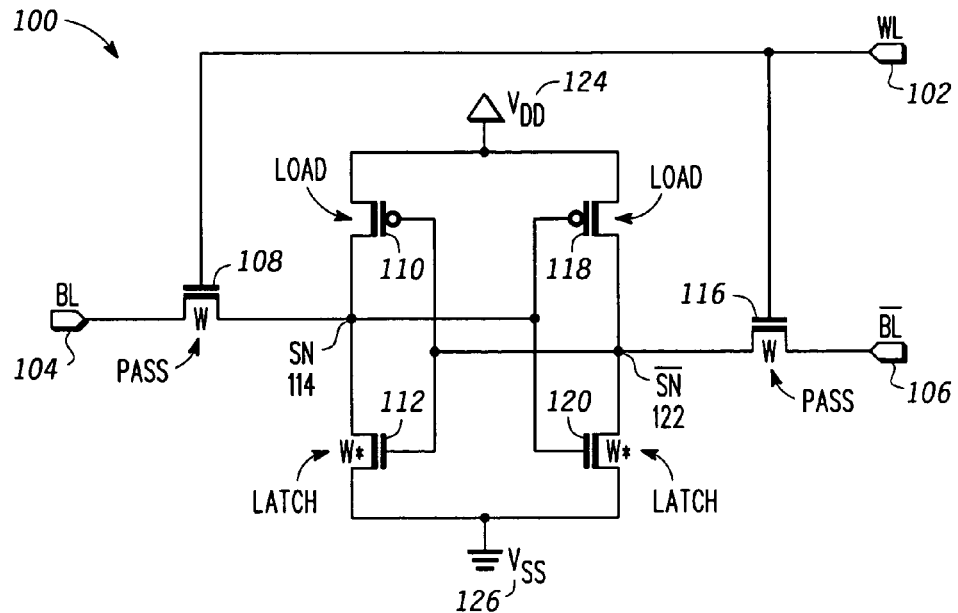
FIG. 1 is a schematic diagram view of a memory with recessed devices according to an embodiment of the present disclosure.

FIG. 1 is a schematic diagram view of a memory 100 with recessed devices according to one embodiment of the present disclosure. In one embodiment, memory 100 includes an SRAM cell for use in a memory application, the SRAM cell including four transistors to form a storage latch, and two transistors used as pass devices. In particular, memory 100 includes a word line 102, bit line 104, and complementary bit line 106. Memory 100 also includes an NFET 108, PFET 110, and NFET 112 on a true side portion of memory 100. Pass transistor 108 couples bit line 104 to storage node 114. Memory 100 further includes an NFET 116, PFET 118, and NFET 120 on a complementary side portion of memory 100. Pass transistor 116 couples complementary bit line 106 to complementary storage node 122. According to one embodiment, pass transistors 108 and 116 have a gate width W, whereas latch transistors 112 and 120 have a segmented gate width W*, wherein $W^* = W_{LS} + W_{LR1} + W_{LR2}$, as discussed further herein below.

In addition, load transistors 110 and 118 couple to voltage source $V_{DD}$, generally indicated by reference numeral 124. Furthermore, latch transistors 112 and 120 couple to voltage source $V_{SS}$, generally indicated by reference numeral 126. Storage node 114 couples to the gate electrodes of transistors 118 and 120. Complementary storage node 122 couples to the gate electrodes of transistors 110 and 112. Moreover, PFET devices 110 and 118 and NFET devices 112 and 120 form a storage latch used to store data in the SRAM cell 100. NFET devices 108 and 116 serve as pass devices to get data to and from the storage latch.

Figure 2:
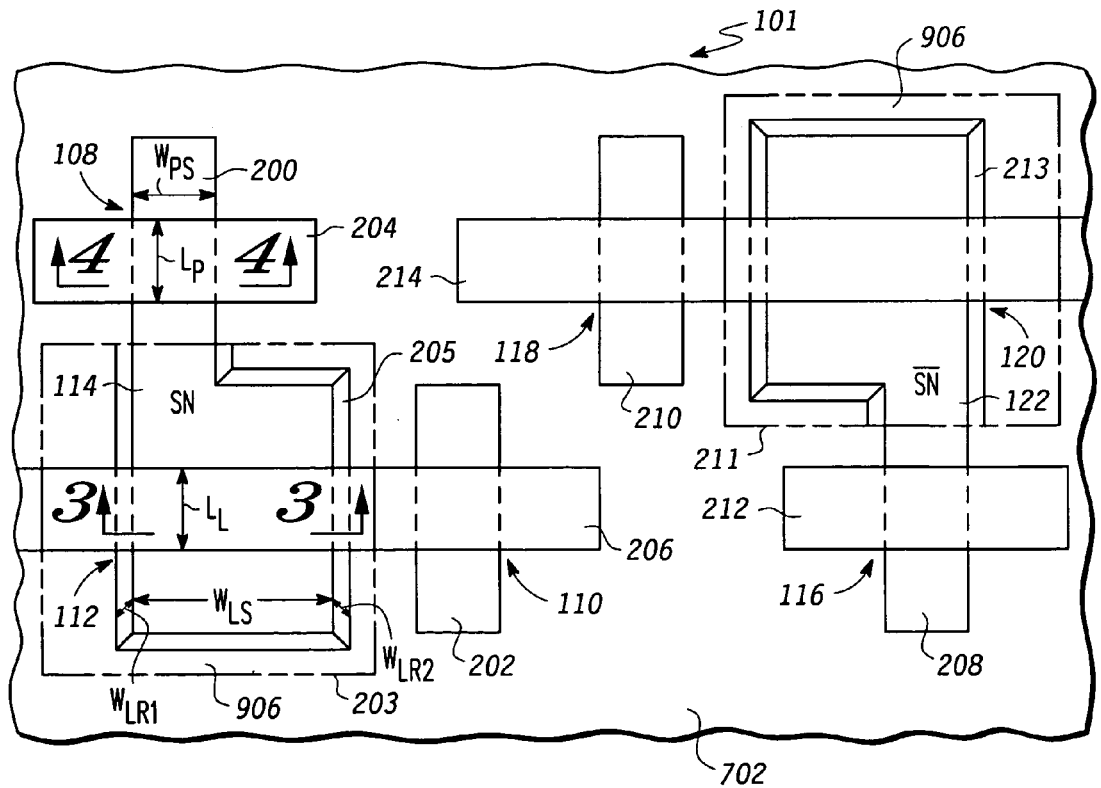
FIG. 2 is a layout diagram view of a portion of the memory of FIG. 1.

FIG. 2 is a layout diagram view of a portion 101 of the memory 100 of FIG. 1. Portion 101 includes regions corresponding to pass transistor 108, latch transistor 112, load transistor 110, and storage node 114, generally shown on the left side of the figure. In addition, portion 101 includes regions corresponding to pass transistor 116, latch transistor 120, load transistor 118, and complementary storage node 122, generally shown on the right portion of the figure. Referring again to the left side of the figure, portion 101 includes active semiconductor regions 200 and 202. Active semiconductor material region 200 is shared between pass transistor 108 and latch transistor 112. In addition, in one embodiment, a width of the active semiconductor material 200 is greater in the region of latch transistor 112 than in the region of pass transistor 108, as discussed further herein below. Furthermore, in one embodiment, semiconductor material region 200 is appropriately doped to render pass transistor 108 and latch transistor 112 as NMOS devices.

Moreover, in one embodiment, active semiconductor material region 202 is appropriately doped to render transistor 110 as a PMOS device.

Reference numeral 203 generally refers to a recessed region of memory 100, the recessed region including an area around part of the active semiconductor material 200. In particular, during formation of the recessed region 203, sidewall portions 205 of the semiconductor material 200 are exposed within the recessed region 203, to be discussed further herein below with respect to the subsequent figures.

Subsequent to formation of the recess region 203, a gate dielectric (not shown) is formed overlying a channel region of respective transistors 108, 110, and 112 of corresponding active semiconductor regions 200 and 202. A gate electrode 204 is also formed overlying the gate dielectric (not shown) of pass transistor device 108. In addition, a gate electrode 206 is formed overlying transistor devices 110 and 112. With respect to latch transistor 112, the gate dielectric and gate electrode overlie sidewall portions 205 in an area of the gate dielectric and gate electrode. Gate electrodes 204 and 206 comprise any suitable electrode material for a particular memory application. For example, electrode material can include any suitable conductive layer such as doped polysilicon, doped silicon germanium (SiGe), doped silicon carbide (SiC), silicides, metal carbides, metal nitrides, and the like, or combinations thereof.

Referring again to the right side of FIG. 2, portion 101 includes active semiconductor regions 208 and 210. Active semiconductor material region 208 is shared between pass transistor 116 and latch transistor 120 of the complementary storage node portion of memory 100. In addition, in one embodiment, a width of the active semiconductor material 208 is greater in the region of latch transistor 120 than in the region of pass transistor 116, similarly with respect to semiconductor material region 200 as discussed herein. Furthermore, in one embodiment, semiconductor material region 208 is appropriately doped to render pass transistor 116 and latch transistor 120 as NMOS devices. Moreover, in one embodiment, active semiconductor material region 210 is appropriately doped to render load transistor 118 as a PMOS device.

Reference numeral 211 generally refers to a recessed region of memory 100, the recessed region including an area around part of the active semiconductor material 208. In particular, during formation of the recessed region 211, sidewall portions 213 of the semiconductor material 208 are exposed within the recessed region 211, similarly with respect to sidewall portions 205 of semiconductor material 200 in recessed region 203.

Subsequent to formation of the recess region 211, a gate dielectric (not shown) is formed overlying a channel region of respective transistors 116, 118, and 120 of corresponding active semiconductor regions 208 and 210. A gate electrode 212 is also formed overlying the gate dielectric (not shown) of transistor device 116. In addition, a gate electrode 214 is formed overlying transistor devices 118 and 120. With respect to latch transistor 120, the gate dielectric and gate electrode 212 overlie sidewall portions 213 in an area of the gate dielectric and gate electrode 212. Gate electrodes 212 and 214 comprise any suitable electrode material for a particular memory application, similarly with respect to gate electrodes 204 and 206.

With reference still to FIG. 2, regions not occupied by the active semiconductor material or gate electrode material, are generally indicated by reference numerals 702 and 906, and can include, for example, any suitable insulation material for a particular memory application. Still further, semiconductor material 200, 202, 208, and 210 can include any suitable semiconductor material, for example, including but not limited to silicon, germanium, silicon-germanium, or other semiconductor material, furthermore, in the form of a bulk semiconductor, semiconductor on insulator, or other.

Figure 3:
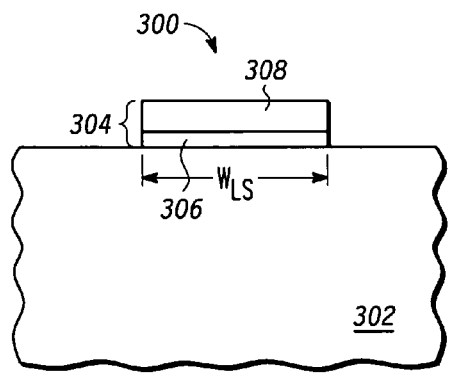
FIG. 3 is a cross-sectional view of a portion of the layout of FIG. 2, taken along line 3—3.

FIG. 3 is a cross-sectional view of a portion 300 of the layout of FIG. 2 during a process step in the method of making memory 100, taken along line 3—3. Portion 300 includes a semiconductor material 302 having a mask stack 304 of a given width, the mask stack 304 having been formed overlying a desired portion of semiconductor material 302. In one embodiment, mask stack 304 of FIG. 3 is made to have a width on the order of $W_{LS}$, corresponding to a surface width of one segment of semiconductor material of the latch transistor 112. In other words, the width $W_{LS}$ of mask stack 304 corresponds to a first surface width of active semiconductor material 200 within the recess region 203 for latch transistor 112. Furthermore, mask stack 304 includes any suitable isolation mask layer or stack of layers, having been patterned by well known resist patterning and etch techniques. In addition, in one embodiment, the mask stack includes an oxide layer 306 and an overlying nitride layer 308, wherein the nitride layer 308 serves as a planarization etch stop, as discussed further herein.

Figure 4:
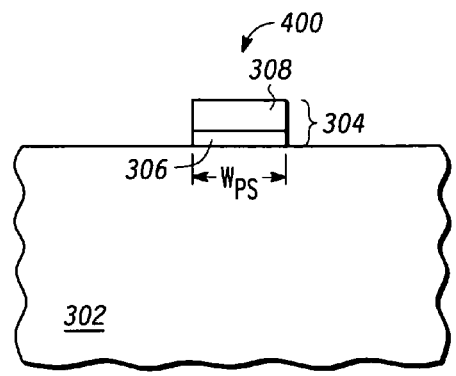
FIG. 4 is a cross-sectional view of a portion of the layout of FIG. 2, taken along line 4—4.

FIG. 4 is a cross-sectional view of a portion 400 of the layout of FIG. 2 during a process step in the method of making memory 100, taken along line 4—4. Portion 400 also includes semiconductor material 302 having mask stack 304 of a second width formed overlying a desired portion thereof. In one embodiment, mask stack 304 of FIG. 4 is made to have a width on the order of $W_{PS}$, corresponding to a surface width of the semiconductor material of the pass transistor 108. In other words, the second width $W_{PS}$ of mask stack 304 corresponds to a surface width of active semiconductor material 200 for pass transistor 108.

Figure 5:
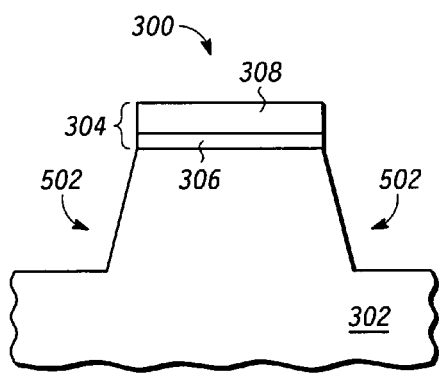
FIGS. 5–14 are cross-sectional views of the portions of the layout shown in FIGS. 3 and 4, respectively, after further processing according to the embodiments of the present disclosure.
Figure 6:
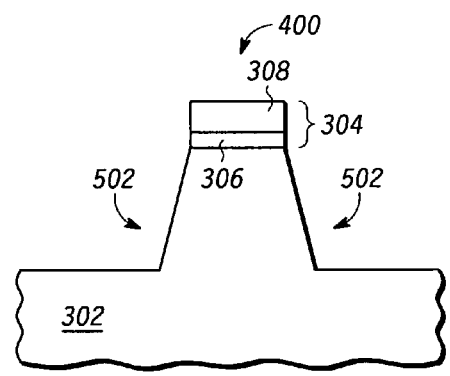

FIGS. 5–13 are cross-sectional views of the portions of the layout shown in FIGS. 3 and 4, respectively, after further processing in the method of making memory 100 according to the embodiments of the present disclosure. In FIGS. 5 and 6, respective portions of semiconductor material 302 are selectively removed with respect to the isolation mask layer 304. Selective removal of the semiconductor material 302 forms trench regions 502. In one embodiment, for a bulk semiconductor material substrate, the trench region 502 can be formed to a depth on the order of 1500–3500 Angstroms. In another embodiment, for a semiconductor on insulator substrate, the trench region 502 can be formed to a depth on the order of 500–1500 Angstroms.

Figure 7:
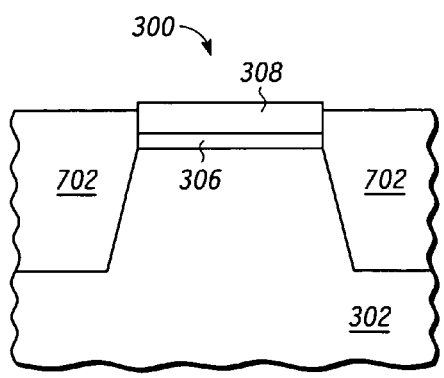
Figure 8:
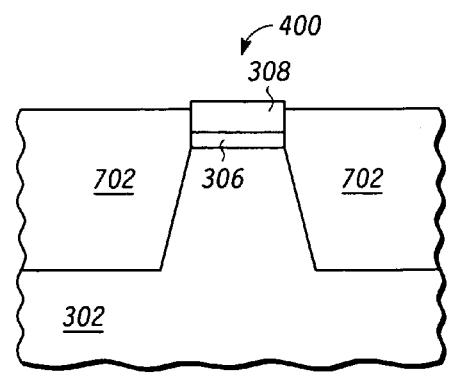

In FIGS. 7 and 8, respective trench regions 502 of FIGS. 5 and 6 are filled with blanket deposition of an isolation material 702 and then planarized. In one embodiment, the isolation material includes any suitable oxide. Other examples of isolation materials include semiconductive materials such as polysilicon, silicon, silicon germanium, germanium, other insulating films such as silicon nitride, the like and combinations of the above. Further, the isolation material can have other layers together with an insulating material. Moreover, planarization can be carried out using any suitable planarization technique known in the art, for example, chemical mechanical polishing or other suitable method. In one embodiment, nitride layer 308 of mask 304 is used as a planarization stop.

Figure 9:
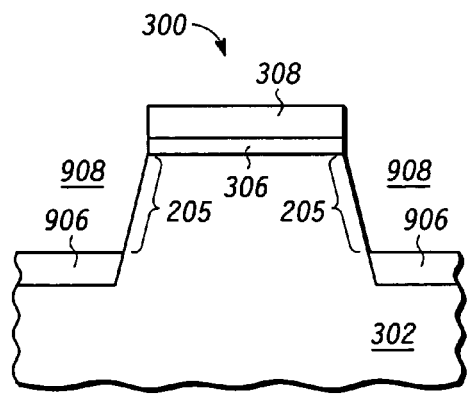
Figure 10:
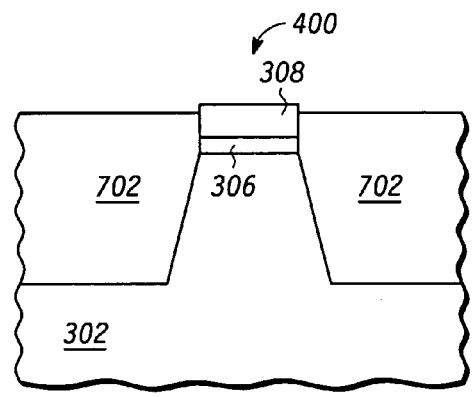

Subsequent to the planarization, portion 400 is masked (not shown) to protect the same, whereas portion 300 is left unmasked. In FIG. 9, a portion of the isolation material 702 is selectively removed using a removal process suitable with respect to the particular isolation material 702. In one embodiment, the removal process includes a dry etch. In particular, subjecting the unmasked portion 300 to the removal process selectively removes isolation material 702, and wherein controlling the removal process enables the obtaining of a desired amount of exposed sidewall portion 205 of semiconductor material 302. A portion of isolation material that remains after the selective removal of isolation material is generally indicated by reference numeral 906, wherein a recess created by the removal of isolation material 702 is generally indicated by reference numeral 908. In FIG. 10, the protective mask (used during partial removal of isolation 702 in region 300 of FIG. 9) is shown removed and the portion 400 remains substantially the same as in that of FIG. 8.

Figure 11:
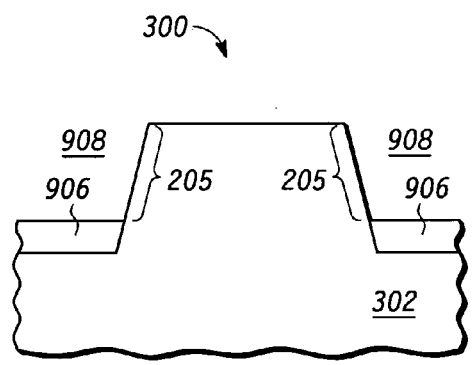
Figure 12:
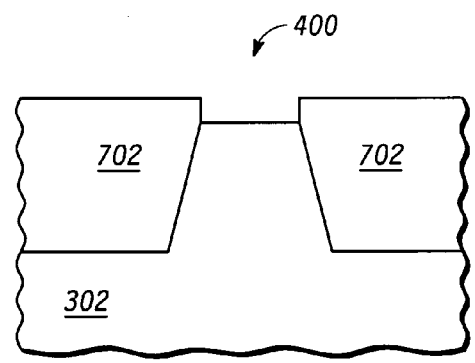

In FIGS. 11 and 12, the mask stack 304 is removed, using any suitable techniques for removal of the same. In one embodiment, the removal of mask stack 304 is generally selective with respect to the semiconductor material (302) and isolation material (702,906). In one example, mask stack 304 includes nitride 308. Prior to removal of the nitride 308, a thin sacrificial oxide can be grown if needed. After stripping the pad/sacrificial oxide, the gate oxide can be grown.

Figure 13:
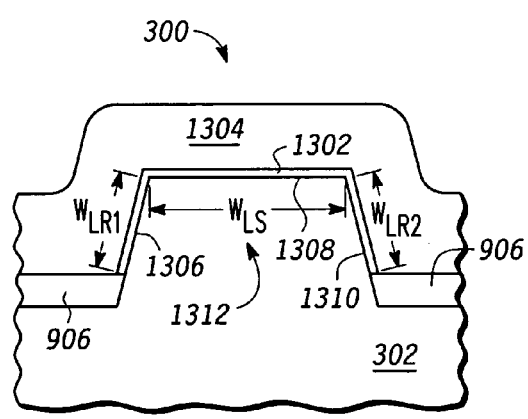
Figure 14:
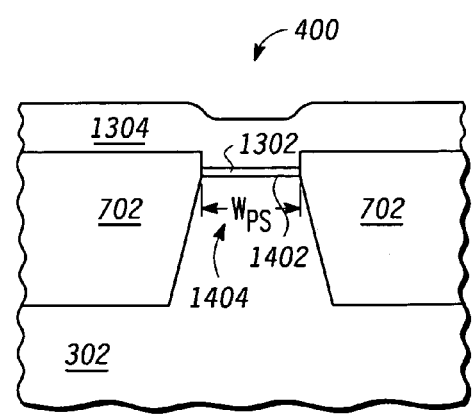

In FIGS. 13 and 14, a gate dielectric 1302 is formed overlying exposed portions of semiconductor material 302. Subsequent to formation of the gate dielectric, a gate electrode material 1304 is deposited, patterned and etched, to form respective gate electrodes, corresponding to respective gate electrodes 206 and 204 of FIG. 2.

With respect to the portion 300 of FIG. 13, the effective channel width ($W^*$) of the latch transistor 112 equals the sum of widths of the segments indicated by reference numerals 1306, 1308, and 1310. In other words, the effective channel width of latch transistor 112 can be represented by the expression $W^*=W_{LR1}+W_{LS}+W_{LR2}$. In one embodiment, $W_{LR1}$ is substantially equal to $W_{LR2}$, wherein the effective channel width of latch transistor 112 can then be represented by the expression $W^*=W_{LS}+2W_{LR1}$. In addition, the channel of latch transistor 112 is generally indicated by reference numeral 1312.

With respect to the portion 400 of FIG. 14, the effective channel width (W) of the pass transistor 108 is generally represented by the width of the surface indicated by reference numeral 1402. In other words, the effective channel width of pass transistor 108 can be represented by the expression $W=W_{PS}$. In addition, the channel of pass transistor 108 is generally indicated by reference numeral 1404.

Accordingly, for an SRAM cell, beta ratio ($\beta_{ratio}$) equals ($W_{Latch}/L_{Latch})/(W_{Pass}/L_{Pass})$. With the present embodiments, the beta ratio ($\beta_{ratio}$) equals $(W^*/L_{Latch})/(W_{Pass}/L_{Pass})$ or $((W_{LR1}+W_{LS}+W_{LR2})/L_{Latch})/(W_{Pass}/L_{Pass})$.

In alternate embodiments, prior to selective formation of the gate dielectric layer(s), additional steps can be included for rounding of corners of the exposed semiconductor material 302 shown in FIG. 11.

As discussed herein, a surface width shall be defined as a width (or widths) that is (are) substantially parallel with a principal surface of the wafer. In addition, a recess width shall be defined as a width (or widths) that is (are) not substantially parallel with the principal surface of the wafer. For example, latch transistor 112 has a segmented gate width, the segmented gate width including the sum of a surface width and two sidewall widths.

Accordingly, with the segmented channel width $W_t$ of the latch transistor that includes recessed sidewall portions as discussed herein, the latch transistor provides a higher SNM and has less SNM variation as $V_t$ scales with 1/(square root of $W_L$). In addition, the change in SNM increases with a corresponding change in $V_t$ of the latch transistor.

Simulations of SNM exhibit significant improvement with a bitcell having a recess on the latch transistor over that of the same bitcell with no recess. In addition, with improved SNM due to the recess of the latch transistor, the pass transistor gate width can be made wider, allowing for an estimated 35% improvement in bitcell drive current ($I_{cell}$) while still meeting low $V_{dd}$ requirements.

In one embodiment, an apparatus comprising a memory cell includes a first device having a first isolation recess amount. The memory cell further includes a second device coupled to the first device, the second device having a second isolation recess amount different from the first isolation recess amount. In one embodiment, the memory cell is a static random access memory cell, the first device is a pass transistor, and the second device is a latch transistor. The pass transistor has a first effective channel width that is substantially equal to a top surface width of the channel of the pass transistor. In addition, the latch transistor has a second effective channel width greater than a top surface width of the channel of the latch transistor.

The apparatus further comprises a substrate under the first and second devices. The top surfaces of the channels of the pass and latch transistors are substantially parallel with a principle surface of the substrate. In particular, the second effective channel is substantially equal to the top surface width of the channel of the latch transistor plus a first sidewall surface width of the channel of the latch transistor plus a second sidewall surface width of the channel of the latch transistor. The sidewall surface widths are measured in a plane which is not substantially parallel with the principle surface of the substrate. Furthermore, in another embodiment, the second effective channel width is substantially equal to a top surface width of the latch transistor plus twice the second isolation recess amount. In another embodiment, the first isolation recess amount is designed to be substantially zero.

According to yet another embodiment, a memory cell includes a first transistor having a first effective channel width, and a second transistor coupled to the first transistor.

The second transistor has a device area substantially equal to the first transistor. In addition, the second transistor has a second effective channel width not substantially equal to the first effective channel width. In one embodiment, the first effective channel width is substantially equal to a top surface width of the channel of the pass transistor and the second effective channel width is greater than a top surface width of the channel of the latch transistor. The second effective channel width is substantially equal to a channel width of a top surface of the channel plus two times a channel width of a side surface of the channel, the top surface of the channel being proximate to a gate of the latch transistor substantially in parallel with a first plane, the side surface being proximate to the gate of the latch transistor and being not substantially parallel with the first plane.

In still another embodiment, the memory cell is a static random access memory cell, the first device is a pass transistor, and the second device is a latch transistor. The memory cell can represent a part of a memory, wherein the memory includes a word line and a bit line, the first transistor having a first current handling electrode coupled to the bit line, a second current handling electrode coupled to a current handling electrode of the second transistor, and a control electrode coupled to the word line. Still further, the memory cell can include a load device, the load device having a first terminal coupled to a first power rail, and a second terminal coupled to the second current handling electrode of the first transistor and the current handling electrode of the second transistor. In another embodiment, the load device is a PMOS FET and the first and second transistors are NMOS FETs. In addition, the memory cell can represent a part of an integrated circuit.

The apparatus further includes an SRAM, the SRAM comprising a plurality of SRAM cells. Each SRAM cell includes a pair of cross-coupled inverters. Each cross-coupled inverter includes a latch transistor having the second effective channel width and a pass transistor having the first effective channel width. The first effective channel width is substantially dependent upon a non-segmented surface of the channel of the pass transistor. In addition, the second effective channel width is dependent upon a segmented surface of the channel of the latch transistor.

In another embodiment, a method of making a memory cell having first and second devices at first and second locations, the method includes forming the first device of the memory cell to have a first isolation recess amount associated therewith. In addition, the method includes forming the second device of the memory cell having a second isolation recess amount associated therewith, the second isolation recess amount being different from the first isolation recess amount.

In one embodiment, the first device and the second device are formed using the shared steps of providing a substrate, forming an isolation mask layer over the substrate, removing portions of the isolation mask layer at locations other than the first and second locations, removing portions of the substrate selective to the isolation mask layer, depositing an insulating layer over remaining portions of the isolation mask layer and the substrate, and planarizing down to the remaining portions of the isolation mask layer. The step of removing portions of the substrate can include performing a dry etch of the substrate and/or performing a wet etch of the substrate.

The step of forming the second device further includes removing portions of the insulating layer selective to the isolation mask layer at the second location but not at the first location. For example, the step of forming the second device can include masking the first location and etching the second location with an etch that is selective to silicon and nitride.

Furthermore, the first device and the second device can be further formed using the shared steps of: removing remaining portions of the isolation masking layer, forming a gate dielectric layer, and forming a gate electrode layer. The method still further includes coupling the first device as a pass transistor of an SRAM memory cell and coupling the second device as a latch transistor of the SRAM memory cell.

According to another embodiment, a method of making a memory cell includes designing a pass transistor of the memory cell to have an effective channel width substantially dependent upon a top surface of a channel of the pass transistor. The method further includes designing a latch transistor of the memory cell to have an effective channel width substantially dependent upon a top surface of the channel of the latch transistor and upon a sidewall surface of the latch transistor. Still further, the method further includes designing the latch transistor to have an effective channel width larger than the effective channel width of the pass transistor, but to have a substantially similar top surface channel width as the pass transistor.

Accordingly, in the present embodiments, trench recess is only applied to the latch (i.e., pull-down) device such that the Beta ratio of the bitcell is greatly enhanced to provide robust SNM (Static-Noise Margin) and enable low Vdd operation. This can be achieved by using a mask that only opens the area around the pull-down devices after trench oxide CMP and then etch the field oxide with a dry etch selective to silicon and nitride (or a wet etch could be employed as well). As mentioned above, with the recessing of the pull-down device alone, the SNM will be robust enough to enable low Vdd operation. Furthermore, the embodiments of the present disclosure will allow modifications to the cell layout such that a wider pass gate width can be utilized to enhance the Icell while preserving adequate SNM for low Vdd operation. Simulations indicate that an improvement of approximately thirty-five percent (~35%) in Icell can be achieved over that of a planar 65 nm cell while still meeting the low Vdd SNM requirement.

The embodiments of the present disclosure can be applied to memory products that use 6T SRAM and 4T SRAM, and either on SOI or bulk. Still further, in one embodiment, the SRAM includes an embedded memory.

In the foregoing specification, the disclosure has been described with reference to various embodiments. However, one of ordinary skill in the art appreciates that various modifications and changes can be made without departing from the scope of the present embodiments as set forth in the claims below. For example, the embodiments of the present disclosure can be applied to benefit current and future generation microprocessors and/or advanced memory devices. Accordingly, the specification and figures are to be regarded in an illustrative rather than a restrictive sense, and all such modifications are intended to be included within the scope of the present embodiments.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements by may include other elements not expressly listed or inherent to such process, method, article, or apparatus.

We claim:

1. An apparatus comprising a static random access memory cell, the static random access memory cell comprising:
    a first device having a first isolation recess amount; and
    a second device coupled to the first device, the second device having a second isolation recess amount different from the first isolation recess amount, wherein the first device is a pass transistor, the second device is a latch transistor, and wherein
    the pass transistor has a first effective channel width being substantially equal to a top surface width of the channel of the pass transistor; and
    the latch transistor has a second effective channel width greater than a top surface width of the channel of the latch transistor.

2. The apparatus of claim 1 further comprising a substrate under the first and second devices, wherein the top surfaces of the channels of the pass and latch transistors are substantially parallel with a principle surface of the substrate.

3. The apparatus of claim 2 wherein the second effective channel width is substantially equal to the top surface width of the channel of the latch transistor plus a first sidewall surface width of the channel of the latch transistor plus a second sidewall surface width of the channel of the latch transistor.

4. The apparatus of claim 3 wherein the sidewall surface widths are measured in a plane which is not substantially parallel with the principle surface of the substrate.

5. The apparatus of claim 1 wherein the second effective channel width is substantially equal to a top surface width of the latch transistor plus twice the second isolation recess amount.

6. An apparatus comprising a memory cell, the memory cell comprising:
    a first transistor having a first effective channel width; and
    a second transistor coupled to the first transistor, the second transistor having a device area substantially equal to the first transistor, the second transistor having a second effective channel width not substantially equal to the first effective channel width,
    wherein the first effective channel width is substantially equal to a top surface width of the channel of the first transistor, and
    wherein the second effective channel width is greater than a top surface width of the channel of the second transistor, further wherein the second effective channel width is substantially equal to a channel width of a top surface of the channel plus two times a channel width of a side surface of the channel, the top surface of the channel being proximate to a gate of the second transistor substantially in parallel with a first plane, the side surface being proximate to the gate of the second transistor and being not substantially parallel with the first plane.

7. The apparatus of claim 6 wherein the memory cell is a static random access memory cell, the first device is a pass transistor, and the second device is a latch transistor.

8. The apparatus of claim 6 wherein the second transistor is connected to the first transistor.

9. The apparatus of claim 6 further comprising a memory, the memory comprising:
    a word line; and
    a bit line, the first transistor having a first current handling electrode coupled to the bit line, a second current handling electrode coupled to a current handling electrode of the second transistor, and a control electrode coupled to the word line.

10. The apparatus of claim 9 wherein the memory cell further comprises a load device, the load device having a first terminal coupled to a first power rail, and a second terminal coupled to the second current handling electrode of the first transistor and the current handling electrode of the second transistor.

11. The apparatus of claim 10 wherein the load device is a PMOS FET and the first and second transistors arc NMOS FETs.

12. The apparatus of claim 10 further comprising an integrated circuit, the integrated circuit comprising the memory.

13. The apparatus of claim 6 further comprising an SRAM, the SRAM comprising a plurality of SRAM cells, each SRAM cell comprising:
    a pair of cross-coupled inverters, each cross-coupled inverter including a latch transistor having the second effective channel width; and
    a pass transistor having the first effective channel width.

14. The apparatus of claim 6 wherein
    the first effective channel width is substantially dependent upon a non-segmented surface of the channel of the pass transistor; and
    the second effective channel width is dependent upon a segmented surface of the channel of the latch transistor.

15. A method of making a static random access memory cell including first and second devices at first and second locations, the method comprising:
    forming a first device of the memory cell to have a first isolation recess amount associated therewith; and
    forming a second device of the memory cell having a second isolation recess amount associated therewith, the second isolation recess amount being different from the first isolation recess amount, wherein the first device is a pass transistor, the second device is a latch transistor, and wherein the pass transistor has a first effective channel width being substantially equal to a top surface width of the channel of the pass transistor; and the latch transistor has a second effective channel width greater than a top surface width of the channel of the latch transistor.

16. The method of claim 15 wherein the first device and the second device are formed using the following shared steps:
    providing a substrate;
    forming an isolation mask layer over the substrate;
    removing portions of the isolation mask layer at locations other than the first and second locations;

removing portions of the substrate selective to the isolation mask layer;

depositing an insulating layer over remaining portions of the isolation mask layer and the substrate; and planarizing down to the remaining portions of the isolation mask layer.

17. The method of claim 16 wherein the substrate is a semiconductor substrate consisting of one of the group consisting of bulk silicon, germanium, silicon on insulator and germanium on insulator.

18. The method of claim 16 wherein the step of forming the isolation mask layer comprises:

forming an oxide layer over the substrate; and forming a nitride layer over the oxide layer.

19. The method of claim 16 wherein the step of removing the portions of the isolation mask layer comprises:

depositing a resist layer in a pattern selective to the first and second locations;

etching the isolation mask layer; and removing the resist layer.

20. The method of claim 16 wherein the step of removing portions of the substrate includes one of the group consisting of performing a dry etch of the substrate and performing a wet etch of the substrate; and the step of planarizing includes chemical mechanical polishing.

21. The method of claim 16 wherein the step of forming the second device comprises removing portions of the insulating layer selective to the isolation mask layer at the second location but not at the first location.

22. The method of claim 21 wherein the step of forming the second device comprises:

masking the first location; and etching the second location with an etch that is selective to silicon and nitride.

23. The method of claim 21 wherein the first device and the second device are formed using the following shared steps:

removing remaining portions of the isolation masking layer;

forming a gate dielectric layer; and forming a gate electrode layer.

24. An SRAM cell formed according to the method of claim 15.

25. A method of making a memory cell comprising:

designing a pass transistor of the memory cell to have an effective channel width substantially dependent upon a top surface of a channel of the pass transistor; and designing a latch transistor of the memory cell to have an effective channel width substantially dependent upon a top surface of the channel of the latch transistor and upon a sidewall surface of the latch transistor.

26. The method of claim 25 further comprising:

designing the larch transistor to have an effective channel width larger than the effective channel width of the pass transistor, but to have a substantially similar top surface channel width as the pass transistor.

\* \* \* \* \*